(12) United States Patent
Kim et al.

(10) Patent No.: US 11,038,146 B2
(45) Date of Patent: Jun. 15, 2021

(54) DISPLAY APPARATUS AND METHOD OF MANUFACTURING THE SAME

(71) Applicant: SAMSUNG DISPLAY CO., LTD., Yongin-si (KR)

(72) Inventors: Hyun Kim, Yongin-si (KR); Sunho Kim, Yongin-si (KR); Sunhee Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/663,183

(22) Filed: Oct. 24, 2019

(65) Prior Publication Data

US 2020/0381659 A1   Dec. 3, 2020

(30) Foreign Application Priority Data

May 27, 2019   (KR) .................. 10-2019-0062051

(51) Int. Cl.
 *H01L 51/52* (2006.01)
 *H01L 27/32* (2006.01)
 *H01L 51/56* (2006.01)
 *H01L 51/00* (2006.01)

(52) U.S. Cl.
 CPC ...... *H01L 51/5253* (2013.01); *H01L 27/3244* (2013.01); *H01L 51/0097* (2013.01); *H01L 51/56* (2013.01); *H01L 2227/323* (2013.01); *H01L 2251/5338* (2013.01)

(58) Field of Classification Search
 CPC . H01L 51/5253; H01L 51/56; H01L 51/0097; H01L 27/3244; H01L 2227/323; H01L 2251/5338
 See application file for complete search history.

(56) References Cited

U.S. PATENT DOCUMENTS

| | | | |
|---|---|---|---|
| 8,890,179 B2 | 11/2014 | Lim et al. | |
| 9,048,455 B2 | 6/2015 | Lee | |
| 2006/0169878 A1* | 8/2006 | Kasano | G06K 9/00006 250/226 |
| 2015/0319813 A1* | 11/2015 | Khachatryan | H05B 33/04 313/504 |
| 2017/0098798 A1* | 4/2017 | Park | H01L 27/3211 |
| 2018/0095570 A1* | 4/2018 | Hong | H01L 27/323 |

FOREIGN PATENT DOCUMENTS

| | | |
|---|---|---|
| KR | 10-2013-0007165 | 1/2013 |
| KR | 10-2014-0038113 | 3/2014 |
| KR | 10-1524365 | 5/2015 |
| KR | 10-2015-0078184 | 7/2015 |
| KR | 10-2016-0027609 | 3/2016 |
| KR | 10-1728372 | 4/2017 |

\* cited by examiner

*Primary Examiner* — Feifei Yeung Lopez

(74) *Attorney, Agent, or Firm* — F. Chau & Associates, LLC

(57) ABSTRACT

A display apparatus includes a substrate, a display layer disposed on the substrate, and a thin film encapsulation layer that covers the display layer. The display layer includes a plurality of emission portions and a non-emission portion around each of the plurality of emission portions. The thin film encapsulation layer includes a first organic film that covers the emission portions, a second organic film that covers the non-emission portion and is spaced apart from the first organic film, and a first inorganic film interposed between the first organic film and the second organic film.

22 Claims, 16 Drawing Sheets

DISPLAY APPARATUS AND METHOD OF MANUFACTURING THE SAME

CROSS-REFERENCE TO RELATED APPLICATION

This application claims priority under 35 U.S.C. § 119 from, and the benefit of, Korean Patent Application No. 10-2019-0062051, filed on May 27, 2019 in the Korean Intellectual Property Office, the contents of which are herein incorporated by reference in their entirety.

BACKGROUND

1. Technical Field

One or more embodiments are directed to a display apparatus and a method of manufacturing the same.

2. Discussion of the Related Art

Display apparatuses such as organic light-emitting display apparatuses may be flexible or bendable and are t manufactured to have a foldable structure for portability.

Display apparatuses typically include a thin film encapsulation layer to prevent external penetration of moisture, oxygen, etc. In general, a thin film encapsulation layer has a stack structure of at least one inorganic film and at least one organic film. The inorganic film mainly prevents penetration of moisture and oxygen, and the organic film mainly relieves stress on the inorganic film and covers possible fine particles on the inorganic film.

SUMMARY

When a display apparatus is used while being continuously folded and unfolded, cracks can occur due to repetitive stress applied to a folding portion, and when the cracks gradually diffuse, the product can be badly damaged to fail to normally operate. In particular, cracks frequently begin in the inorganic film of a thin film encapsulation layer, and thus, solutions to the above issue are desired.

One or more embodiments include a display apparatus that can prevent the occurrence and diffusion of cracks in a thin film encapsulation layer, and a method of manufacturing the display apparatus.

According to one or more embodiments, a display apparatus includes: a substrate; a display layer disposed on the substrate; and a thin film encapsulation layer that covers the display layer. The display layer includes a plurality of emission portions and a non-emission portion around each of the plurality of emission portions. The thin film encapsulation layer includes: a first organic film that covers the plurality of emission portions; a second organic film that covers the non-emission portion and is spaced apart from the first organic film; and a first inorganic film interposed between the first organic film and the second organic film.

The first organic film, the second organic film, and the first inorganic film may be on different layers from one another.

One of the first organic film and the second organic film may be an inner organic film disposed closer to the display layer that the other of the first organic film and the second organic film and is covered by the first inorganic film, and the other of the first organic film and the second organic film may be an outer organic film disposed farther from the display layer. The first inorganic film may include an undulating pattern in which a region on the inner organic film is convex and a region not on the inner organic film is concave, depending on a presence or absence of the inner organic film.

The first organic film may be the inner organic film, and the second organic film may be the outer organic film.

The second organic film may be the inner organic film, and the first organic film may be the outer organic film.

The outer organic film may be separated into a plurality of island-shaped outer organic films along the undulating pattern or may be integrally connected into a single layer beyond the undulating pattern.

The thin film encapsulation layer may further include a second inorganic film disposed as an outermost layer on the first organic film, the second organic film, and the first inorganic film. The thin film encapsulation layer may further include a region where the first inorganic film and the second inorganic film directly contact each other.

The thin film encapsulation layer may further include a gas-blocking film that directly contacts the display layer.

The gas-blocking film may include one of an organic film or an inorganic film.

The gas-blocking film may include hexamethyldisiloxane (HMDSO).

According to one or more embodiments, a method of manufacturing a display apparatus includes: forming a display layer on a substrate; and forming a thin film encapsulation layer that covers the display layer. The display layer includes a plurality of emission portions and a non-emission portion around each of the plurality of emission portions. Forming the thin film encapsulation layer includes: forming a first organic film that covers the plurality of emission portions; forming a second organic film that covers the non-emission portion and is spaced apart from the first organic film; and forming a first inorganic film between the first organic film and the second organic film.

The first organic film, the second organic film, and the first inorganic film ay be on different layers from one another.

One of the first organic film and the second organic film may be an inner organic film formed closer to the display layer than the other of the first organic film and the second organic film. The first inorganic film may be formed on the inner organic film and has an undulating pattern that entirely covers the display layer in which a region of the first inorganic film on the inner organic film is convex and a region of the first inorganic film not on the inner organic film is concave, wherein the other of the first organic film and the second organic film may be formed on the concave region of the first inorganic film as an outer organic film that is farther from the display layer.

The first organic film may be the inner organic film, and the second organic film may be the outer organic film.

The second organic film may be the inner organic film, and the first organic film may be the outer organic film.

The outer organic film may be separated into a plurality of island-shaped outer organic films along the undulating pattern or may be integrally connected into a single layer beyond the undulating pattern.

Forming the thin film encapsulation layer may further include forming a second inorganic film as an outermost layer on the first organic film, the second organic film, and the first inorganic film. The thin film encapsulation layer may include a region where the first inorganic film and the second inorganic film directly contact each other.

Forming the thin film encapsulation layer may further include forming a gas-blocking film that directly contacts the display layer.

The gas-blocking film may include one of an organic film or an inorganic film.

The gas-blocking film may include hexamethyldisiloxane (HMDSO).

According to one or more embodiments, a display apparatus includes a substrate; a display layer disposed on the substrate: and a thin film encapsulation layer that covers the display layer. The thin film encapsulation layer includes a first organic film, a second organic film, and a first inorganic film interposed between the first organic film and the second organic film. One of the first organic film and the second organic film is an inner organic film disposed closer to the display layer that the other of the first organic film and the second organic film and is covered by the first inorganic film, and the other of the first organic film and the second organic film is an outer organic film disposed on the first inorganic film. The first inorganic film comprises an undulating pattern that is convex on a region with the inner organic film and concave on a region without the inner organic film, depending on a presence or absence of the inner organic film.

The display layer may further include a plurality of emission portions and a non-emission portion around each of the plurality of emission portions, the first organic film may cover the plurality of emission portions, and the second organic film may coves the non-emission portion and is spaced apart from the first organic film.

DETAILED DESCRIPTION

Figure 1:
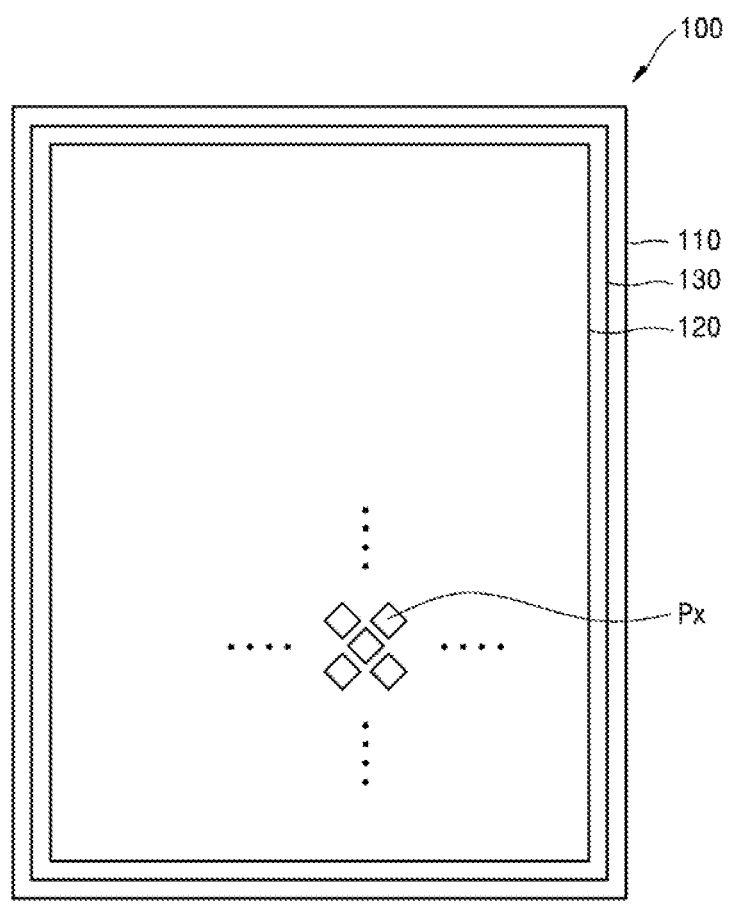
FIG. 1 is a schematic plan view of a display apparatus according to an embodiment.

Reference will now be made in detail to exemplary embodiments, examples of which are illustrated in the accompanying drawings, wherein like reference numerals may refer to like elements throughout. In this regard, exemplary embodiments may have different forms and should not be construed as being limited to the descriptions set forth herein.

In the drawings, components may be exaggerated, omitted, or schematically illustrated for convenience or clarity of description, and size of each component may not completely reflect the actual size.

It will be understood that, when a component is referred to as being "on" or "under" another component, it can be directly or indirectly on the other component.

Reference will now be made in detail to exemplary embodiments, examples of which are illustrated in the accompanying drawings, wherein like reference numerals refer to may like elements throughout and a repeated description thereof is omitted.

FIG. 1 is a plan view of a display apparatus e of the display apparatus.

Figure 2A:
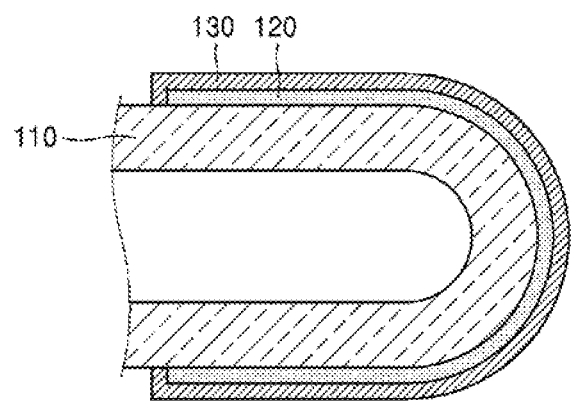
FIGS. 2A and 2B are cross-sectional views of a folded state of a display apparatus shown in FIG. 1.
Figure 2B:
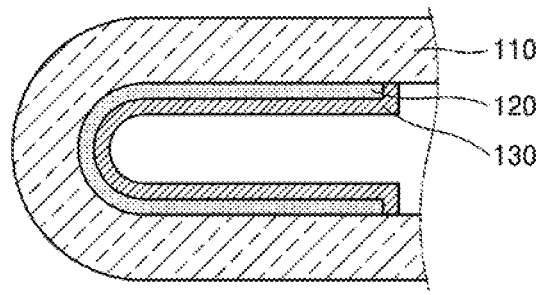

According to an embodiment, a display apparatus includes a flexibly bendable display panel 10. The display panel 100 has a structure in which a display layer 120 that includes a plurality of pixels Px that display an image and a thin film encapsulation layer 130 that covers and protects the display layer 120 are stacked on a generally flexible substrate 110y, and because the flexible substrate 110 is used instead of a hard glass substrate, the display panel 100 can be freely folded and unfolded as far as the flexibility thereof allows. Accordingly, a folding state of the display panel 100 involves out-folding the display panel 100 so that the display layer 120 is on the outside, as shown in FIG. 2A, or in-folding the display panel 100 so that the display layer 120 is on the inside as shown in FIG. 2B. In addition, the display panel 100 may be supported by a case to be folded and unfolded.

However, a folding portion of the display panel 100 which is repeatedly folded and unfolded is subject to compressive and tensile stresses whenever such folding and unfolding are performed. That is, in the folded state shown in FIG. 2A or 2B, compressive stresses are applied to the layers on an inner surface of the folding portion, and tensile stresses is applied to the layers on an outer surface thereof. As such, when stresses in different directions are repetitively applied, cracks can occur and diffuse in a region subject to the stresses. In particular, as described above, cracks frequently begin in first and second inorganic films 133 and 134 of the thin film encapsulation layer 130, shown in FIG. 4A.

According to an embodiment, to address this phenomenon, the thin film encapsulation layer 130 is formed as shown in FIGS. 3A to 4B. FIG. 3B is a cross-sectional view of the thin film encapsulation layer 130 that illustrates a structure of a pixel Px of the display layer 120. FIGS. 4A and 48 illustrate a detailed structure of the thin film encapsulation layer 130 but schematically illustrate the structure of the pixel Px.

Figure 3A:
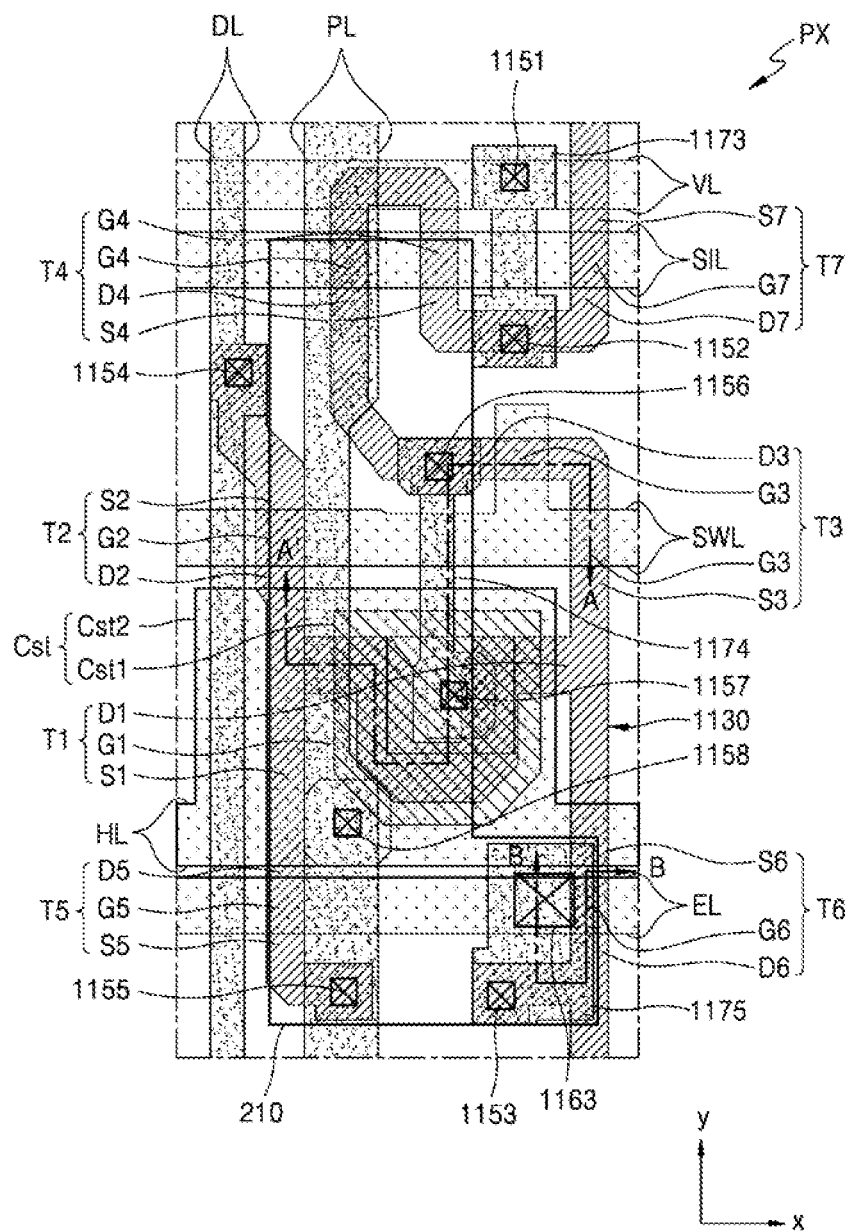
FIGS. 3A and 3B are respectively a plan view and a cross-sectional view of an internal structure of a pixel of a display apparatus shown in FIG. 1.
Figure 3B:
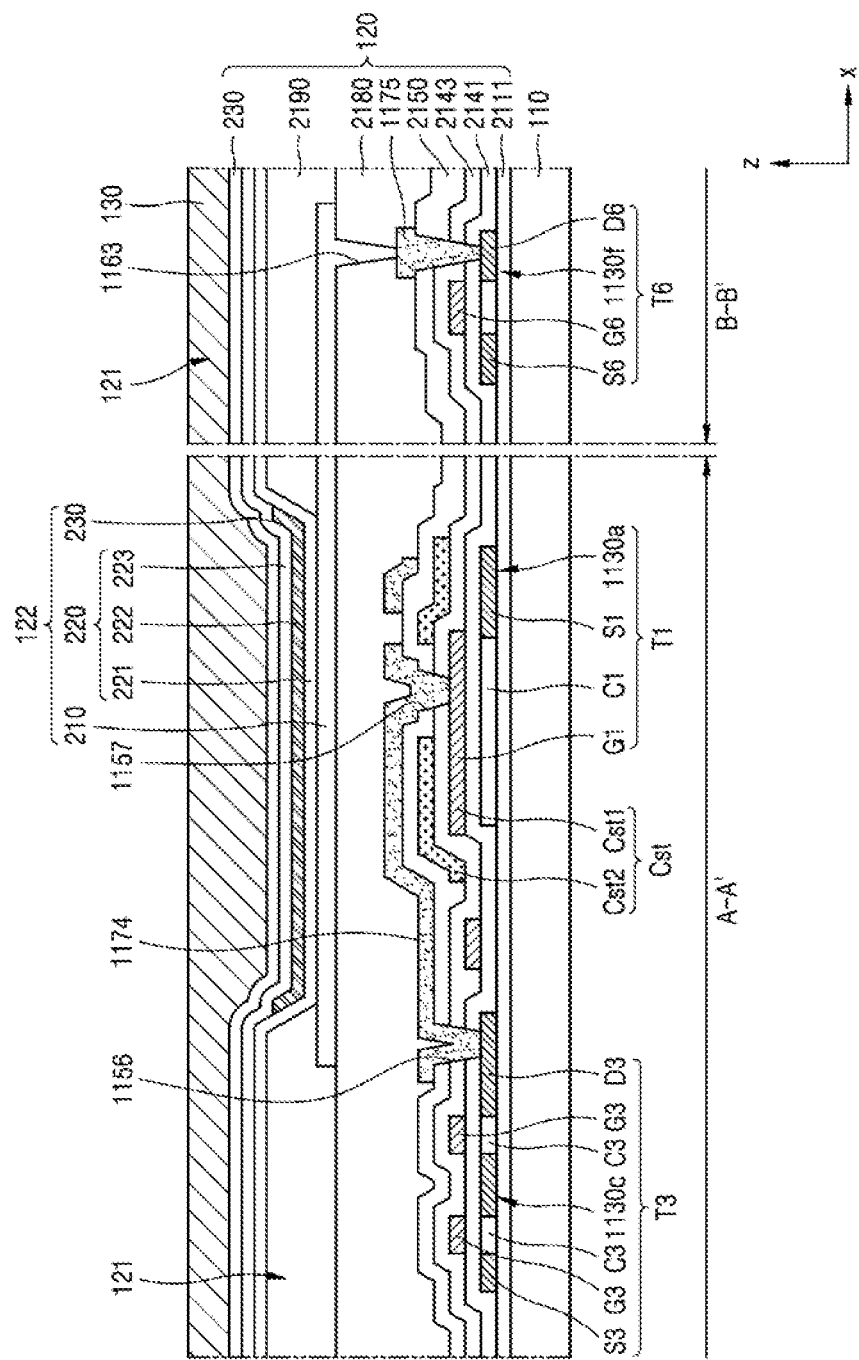

According to an embodiment, the structure of the pixel Px of the display layer 120 covered by the thin film encapsulation layer 130 will be described with reference to FIGS. 3A and 3B. FIG. 3A is a plan view of the pixel Px, and FIG. 3B is a cross-sectional view taken along line A-A' and line B-B' of FIG. 3A. FIG. 3A illustrates a structure of thin film transistors T1 to T7 and a capacitor Cst in the pixel Px. FIG. 3B illustrates an emission portion 122 and the thin film encapsulation layer 130 over the thin film transistors T1 to T7 and the capacitor Cst.

Referring to FIG. 3B, according to an embodiment, each pixel Px includes the emission portion 122 where light Is emitted that displays an image and a non-emission portion 121 that surrounds each emission portion 122.

According to an embodiment, the substrate 110 includes a flexible material that curves and bends, and is foldable or rollable. The flexible material used to form the substrate 110 may be an ultra-thin glass, a metal, or plastic. When the substrate 110 includes plastic, the substrate 110 may include polyimide (PI). In another embodiment, the substrate 110 may include a different type of plastic.

An internal structure of the pixel Px of the display layer 120 will now be described with reference to FIGS. 3A and 3B. According to an embodiment, a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7 are disposed on a semiconductor layer 1130. As shown in FIG. 3B, semiconductor layers 1130a, 1130c and 1130f are disposed above the substrate 110, and a buffer layer 2111 that includes an inorganic material such as silicon oxide, silicon nitride, or silicon oxynitride is disposed under the semiconductor layer 1130.

According to an embodiment, some regions of the semiconductor layer 1130 correspond to semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7. According to an embodiment, semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 are connected to each other and are curved into various shapes. FIG. 3B illustrates a driving semiconductor layer 1130a of the driving thin film transistor T1, a compensation semiconductor layer 1130c of the compensation thin film transistor T3, and an emission control semiconductor layer 1130f of the emission control thin film transistor T6 that correspond to some regions of the semiconductor layer 1130.

According to an embodiment, the semiconductor layer 1130 include channel regions, and source regions and drain regions on each side of the channel region, where each source region and drain region corresponds to a source electrode and a drain electrode, respectively, of a corresponding thin film transistor. Hereinafter, for convenience of description, the source region and the drain region will be referred to as a source electrode and a drain electrode, respectively.

According to an embodiment, the driving thin film transistor T1 includes a driving gate electrode G1 that overlaps a driving channel region, and a driving source electrode S1 and a driving drain electrode D1 on each side of the driving channel region. The driving channel region has a bent shape such as an omega shape and thus has a long channel length within a narrow space. Increasing a length of the driving channel region increases a driving range of a gate voltage, and thus, grayscales of light emitted from an organic light-emitting diode OLED can be more precisely controlled and display quality can be improved.

According to an embodiment, the switching thin film transistor T2 includes a switching gate electrode G2 that overlaps a switching channel region, and a switching source electrode S2 and a switching drain electrode D2 on each side of the switching channel region. The switching drain electrode D2 is connected to the driving source electrode S1.

According to an embodiment, the compensation thin film transistor T3, which is a dual thin film transistor, includes compensation gate electrodes G3 that overlap two compensation channel regions, and a compensation source electrode 53 and a compensation drain electrode D3 on each side of the channel regions. The compensation thin film transistor T3 is connected to the driving gate electrode G1 of the driving thin film transistor T1 via a node connection line 1174 described below.

According to an embodiment, the first initialization thin film transistor T4, which is a dual thin film transistor, includes first initialization gate electrodes G4 that overlap two first initialization channel regions, and a first initialization source electrode 54 and a first initialization drain electrode D4 on each side of the channel regions.

According to an embodiment, the operation control thin film transistor T5 includes an operation control gate electrode G5 that overlaps an operation control channel region, and an operation control source electrode S5 and an operation control drain electrode D5 on each side of the channel region. The operation control drain electrode D5 is connected to the driving source electrode S1.

According to an embodiment, the emission control thin film transistor T6 includes an emission control gate electrode G6 that overlaps an emission control channel region, and an emission control source electrode S6 and an emission control drain electrode D6 on each side of the channel region. The emission control source electrode S6 is connected to the driving drain electrode D1.

According to an embodiment, the second initialization thin film transistor T7 includes a second initialization gate electrode G7 that overlaps a second initialization channel region, and a second initialization source electrode 57 and a second initialization drain electrode D7 on each side of the channel region.

According to an embodiment, the above thin film transistors are connected to signal lines SWL, SIL, EL, and DL, an initialization voltage line VL, and a driving voltage line PL.

Referring now to FIG. 3B, according to an embodiment, a gate insulating layer 2141 is disposed on the semiconductor layer 1130, and a scan line SWL, a previous scan line SIL, an emission control line EL, and the driving gate electrode G1 are disposed on the gate insulating layer 2141. The gate insulating layer 2141 includes an inorganic material such as silicon oxide, silicon nitride, or silicon oxynitride. The scan line SWL, the previous scan line SIL, the emission control line EL, and the driving gate electrode G1 include a metal such as molybdenum (Ma), aluminum (Al), copper (Cu), titanium (Ti), or an alloy thereof.

Referring back to FIG. 3A, according to an embodiment, the scan line SWL extends in an X direction. Some regions of the scan line SWL correspond to the switching and compensation gate electrodes G2 and G3. For example, regions of the scan line SWL that overlap the channel regions of the switching and compensation thin film transistors 12 and T3 function as the switching and compensation gate electrodes G2 and G3, respectively.

According to an embodiment, the previous scan line SIL extends in the X direction, and some regions thereof correspond to the first and second initialization gate electrodes G4 and G7, respectively. For example, regions of the previous scan line SIL that overlap the channel regions of the first and second initialization thin film transistors T4 and T7 function as the first and second initialization gate electrodes G4 and G7, respectively.

According to an embodiment, the emission control line EL extends in the X direction. Some regions of the emission control line EL correspond to the operation control and emission control gate electrodes G5 and G6, respectively.

For example, regions of the emission control line EL that overlap the channel regions of the operation control and emission control thin film transistors T5 and T6 function as the operation control and emission control gate electrodes G5 and G6, respectively.

According to an embodiment, the driving gate electrode G1, which is an island-type electrode, is connected to the compensation thin film transistor T3 via the node connection line 1174.

According to an embodiment, the initialization voltage line VL and an electrode voltage line HL are disposed above the scan line SWL, the previous scan line SIL, the emission control line EL, and the driving gate electrode G1 with a first interlayer insulating layer 2143, shown in FIG. 3B, interposed therebetween. The first interlayer insulating layer 2143 includes an inorganic material.

According to an embodiment, the initialization voltage line VL extends in the X direction. The initialization voltage line VL is connected to the first and second initialization thin film transistors T4 and T7 via an initialization connection line 1173.

According to an embodiment, the initialization voltage line VL is disposed on the first interlayer insulating layer 2143, and in some embodiments, is disposed on a planarization insulating layer 2180 and includes the same material as a pixel electrode 210.

As shown in FIG. 3A, according to an embodiment, the electrode voltage line HL extends in the X direction and crosses a data line DL and the driving voltage line PL. A portion of the electrode voltage line HL covers at least a portion of the driving gate electrode G1 and forms a storage capacitor Cst together with the driving gate electrode G1. For example, the driving gate electrode G1 is a first storage capacitive plate Cst1 of the storage capacitor Cst, and a portion of the electrode voltage line HL is a second storage capacitive plate Cst2 of the storage capacitor Cat.

According to an embodiment, the second storage capacitive plate Cst2 is electrically connected to the driving voltage line PL. In this regard, FIG. 3A illustrates that the electrode voltage line HL is connected to the driving voltage line PL via a contact hole 1158 and the driving voltage line PL is disposed on the electrode voltage line HL. The electrode voltage line HL has the same voltage level, which is a constant voltage, such as +5V, as the driving voltage line PL. The electrode voltage line HL is a transverse driving voltage line.

According to an embodiment, the driving voltage line PL extends in a Y direction that crosses the X direction and the electrode voltage line HL electrically connected to the driving voltage line PL extends in the X direction, and accordingly, a plurality of driving voltage lines PL and electrode voltage lines HL form a mesh structure over a display area.

According to an embodiment, the data line DL, the driving voltage line PL, the initialization connection line 1173, and the node connection line 1174 are disposed above the second storage capacitive plate Cst2 and the electrode voltage line HL with a second interlayer insulating layer 2150 interposed therebetween. The second interlayer insulating layer 2150 includes an inorganic material. The data line DL, the driving voltage line PL, the initialization connection line 1173, and the node connection line 1174 include aluminum (Al), copper (Cu), or titanium (Ti), etc., and may have a multi-layer or single-layer structure. According to an embodiment, the driving voltage line PL, the data line DL, etc., have a multi-layer structure of Ti/Al/Ti.

According to an embodiment, the data line DL extends in the Y direction and is connected to the switching source electrode S2 of the switching thin film transistor T2 via a contact hole 1154. A portion of the data line DL functions as the switching source electrode S2.

According to an embodiment, the driving voltage line PL extends in the Y direction and is connected to the electrode voltage line HL via the contact hole 1158 as described above. In addition, the driving voltage line PL is connected to the operation control thin film transistor T5 via a contact hole 1155. The driving voltage line PL is connected to the operation control drain electrode D5 via the contact hole 1155.

According to an embodiment, one end of the initialization connection line 1173 is connected to the first and second initialization thin film transistors T4 and T7 via a contact hole 1152, and the other end is connected to the initialization voltage line VL via a contact hole 1151.

According to an embodiment, one end of the node connection line 1174 is connected to the compensation drain electrode D3 via a contact hole 1156, and the other end is connected to the driving gate electrode G1 via a contact hole 1157.

According to an embodiment, the pixel electrode 210 is in contact with a contact metal 1175 via a contact hole 1163, and the contact metal 1175 is in contact with the emission control drain electrode D6 via the contact hole 1153 that penetrates the second interlayer insulating layer 2150, the first interlayer insulating layer 2143, and the gate insulating layer 2141. The emission control thin film transistor T6 is electrically connected to the pixel electrode 210 of the organic light-emitting diode OLE© through the contact metal 1175.

According to an embodiment, the planarization insulating layer 2180 includes an organic insulating material and is disposed on the data line DL, the driving voltage line PL, the initialization connection line 1173, and the node connection line 1174, and the pixel electrode 210 is disposed on the planarization insulating layer 2180.

Referring to FIG. 3B, according to an embodiment, edges of the pixel electrode 210 are covered by a pixel-defining film 2190 disposed on the planarization insulating layer 2180, and a central region of the pixel electrode 210 is exposed by an opening in the pixel-defining film 2190. The pixel electrode 210 includes a reflecting film that includes at least one of silver (Ag), magnesium (Mg), aluminum (Al), platinum (Pt), palladium (Pd), gold (Au), nickel (Ni), neodymium (Nd), iridium (1r), chromium (Cr), or a compound thereof. According to another embodiment, the pixel electrode 210 further includes a film on or under the above reflecting film, where the film includes ITO, IZO, ZnO, or $In_2O_3$. An intermediate layer 220 is disposed on the portion of the pixel electrode 210 exposed by the opening.

According to an embodiment, the intermediate layer 220 includes an emission layer 222 disposed above the exposed portion of the pixel electrode 210. The emission layer 222 includes a polymer or low-molecular weight organic material emitting light that has a predetermined color. According to an embodiment, as shown in FIG. 3B, the intermediate layer 220 may include a first functional layer 221 under the emission layer 222 and an optional second functional layer 223 on the emission layer 222.

According to an embodiment, the first functional layer 221 may have a single-layer or multi-layer structure. For example, when the first functional layer 221 includes a polymer material, the first functional layer 221 is a hole transport layer (HTL) that has a single-layer structure and includes poly-(3,4)-ethylene-dihydroxy thiophene (PEDOT) or polyaniline (PAM). When the first functional layer 221 includes a low-molecular weight material, the first functional layer 221 includes a hole injection layer (HIL) and an HTL.

According to an embodiment, the second functional layer 223 is optional. For example, when the first functional layer 221 and the emission layer 222 include a polymer material, the second functional layer 223 is formed to improve characteristics of the organic light-emitting diode OLED. The second functional layer 223 may have a single-layer or multi-layer structure. The second functional layer 223 includes an electron transport layer (ETL) or an electron injection layer (EIL).

According to an embodiment, an opposite electrode 230 faces the pixel electrode 210 with the intermediate layer 220 interposed therebetween. The opposite electrode 230 includes a conductive material having a low work function. For example, the opposite electrode 230 includes a (semi) transparent layer that includes at least one of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the opposite electrode 230 further includes a layer that includes ITO, IZO, ZnO, or $In_2O_3$ on the (semi)transparent layer.

According to an embodiment, the thin film encapsulation layer 130 that covers and seals the display layer 120 is disposed on the opposite electrode 230.

A structure of the thin film encapsulation layer 130 will now be described in detail with reference to FIGS. 4A and 4B.

Figure 4A:
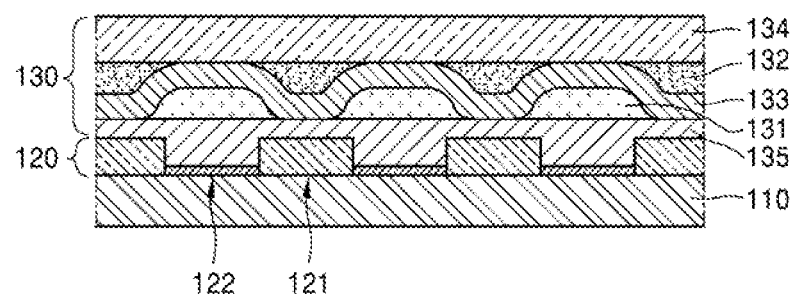
FIG. 4A is a cross-sectional view of a detailed structure of a thin film encapsulation layer shown in FIG. 3B.
Figure 4B:
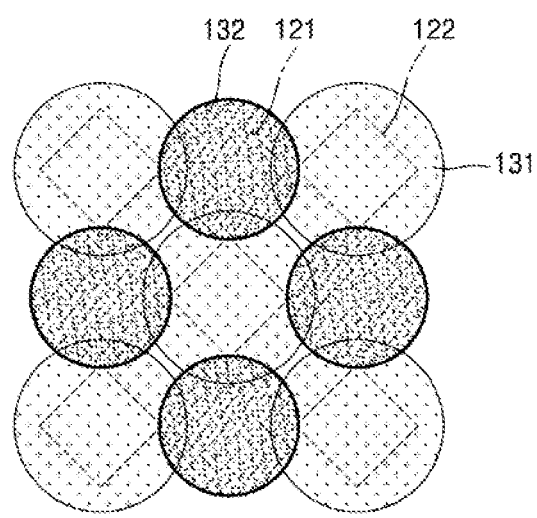
FIG. 4B is a plan view of an arrangement of organic films in a thin film encapsulation layer shown in FIG. 4A.

According to an embodiment, to describe the layers that constitute the thin film encapsulation layer 130, a structure of the pixel Px of the display layer 120 under the thin film encapsulation layer 130 is simply illustrated in FIGS. 4A and 4B. A region where emission occurs due to the above organic emission layer is the emission portion 122, and a region where the pixel-defining film 2190 surrounds the emission portion 122 is the non-emission portion 121.

According to an embodiment, the thin film encapsulation layer 130 prevents penetration of external oxygen and moisture into the display layer 120 and includes a layer in which first and second organic films 131 and 132 and the first and second inorganic films 133 and 134 are stacked. In general, the first and second inorganic films 133 and 134 mainly prevent penetration of moisture and oxygen, and the first and second organic films 131 and 132 mainly relieve stress on the inorganic films. In addition, a gas-blocking film 135 that includes hexamethyldisiloxane (HMDSO) is formed on the inside that contacts the display layer 120, forms a flat base layer of the thin film encapsulation layer 130 and prevents gas generated in the display layer 120 from being released outside.

According to an embodiment, the first and second organic films 131 and 132 include the first organic film 131 that covers a top of the emission portion 122 and the second organic film 132 that covers a top of the non-emission portion 121. That is, instead of having each of the first and second organic films 131 and 132 cover the entire top surface of the display layer 120, the first organic film 131 and the second organic film 132 are disposed on different layers from each other and cover the emission portion 122 and the non-emission portion 121, respectively. FIG. 4B shows an arrangement of organic films of the thin film encapsulation layer on the same plane. Although there are some overlapping regions on the same plane, the first and second organic films 131 and 132 are separated into different layers from each other.

According to an embodiment, materials of the first and second organic films 131 and 132 include poly(methyl methacrylate) (PMMA), polycarbonate (PC), polystyrene (PS), acrylic resin, epoxy-based resin, polyimide, or polyethylene, etc.

In addition, according to an embodiment, the first inorganic film 133 prevents penetration of moisture and oxygen and is interposed between the first organic film 131 and the second organic film 132. Because the first inorganic film 133 is disposed on the first organic film 131, the first inorganic film 133 has an undulating pattern along step curves of a region having the first organic film 131 and a region not having the first organic film 131. That is, a concave shape is formed over the emission portion 122, which has the first organic film 131, and a concave shape is formed over the non-emission portion 121 which does not have the first organic film 131. In addition, the second organic film 132 fills the concave region.

According to an embodiment, when the first inorganic film 133 has an undulating pattern as described above, the flexibility required to fold a display apparatus can significantly increase. That is, compared to a flat case, in an undulating case, since the undulations become smooth and narrow due to compression and elongation, respectively, there is capacity to absorb stress, and because the first and second organic films 131 and 132 including a ductile material that fills the space between the undulations, a folding stress can be easily absorbed.

According to an embodiment, the second inorganic film 134 is an outermost layer of the thin film encapsulation layer 130 and covers both the first inorganic film 133 and the second organic film 132. Accordingly, the second inorganic film 134 directly contacts the second organic film 132 and portions of the first inorganic film 133. When the first and second inorganic films 133 and 134 even partially directly contact each other as described above, adhesive strength increases, and thus, even when the second inorganic film 134 is thin, an effective inorganic film barrier can be formed. Forming a thin second inorganic film 134 is an additional factor that increases flexibility.

According to an embodiment, the first and second inorganic films 133 and 134 include one or more of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride (SiON).

According to an embodiment, the thin film encapsulation, layer 130 having the above structure can be manufactured through processes as shown in FIGS. 5A to 5E.

Figure 5A:
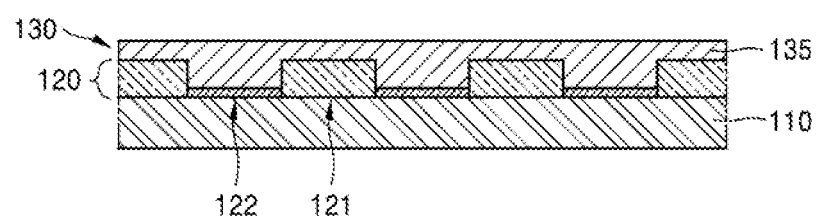
FIGS. 5A to 5E are cross-sectional views that sequentially illustrate a process of manufacturing a thin film encapsulation layer shown in FIG. 4A.

First, according to an embodiment, as shown in FIG. 5A, the gas-blocking film 135 that includes HMDSO is formed on the display layer 120. That is, the gas-blocking film 135 is formed by plasma enhanced chemical vapor deposition (PECVD) using a material gas HMDSO and a reaction gas $N_2$ or $N_2O$, and when $N_2$ is used as a reaction gas, HMDSO has qualities of an inorganic film, and when $N_2O$ is used as a reaction gas, HMDSO has qualities of an organic film. It does not matter whether the gas-blocking film 135 is formed to have qualities of an organic film or an inorganic film, and in both cases, compared to general monomers, generates little gas on its own, and further, can block gas from escaping.

Figure 5B:
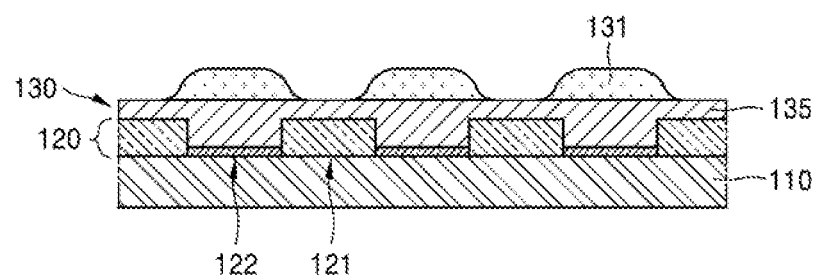

Next, according to an embodiment, as shown in FIG. 5B, the first organic film 131 is formed above the emission portion 122. However, no first organic film 131 is formed above the non-emission portion 121.

Figure 5C:
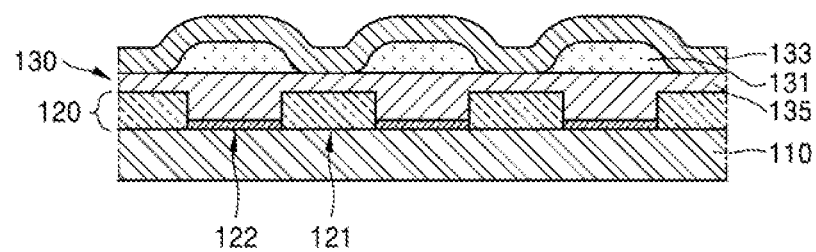

In this state, according to an embodiment, when the first inorganic film 133 is formed as shown in FIG. 5C, the first inorganic film 133 has as undulating pattern along curves that result from the presence and absence of the first organic film 131.

Figure 5D:
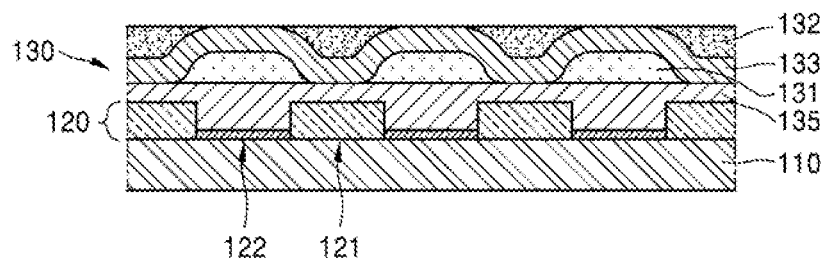

In addition, according to an embodiment, as shown in FIG. 5D, the second organic film 132 is formed above the non-emission portion 121 that correspond to grooves of the undulating pattern. Thus, a flexible thin film encapsulation layer 130 in which the first and second organic films 131 and 132 fill spaces between undulations of the first inorganic film 133 is manufactured.

Figure 5E:
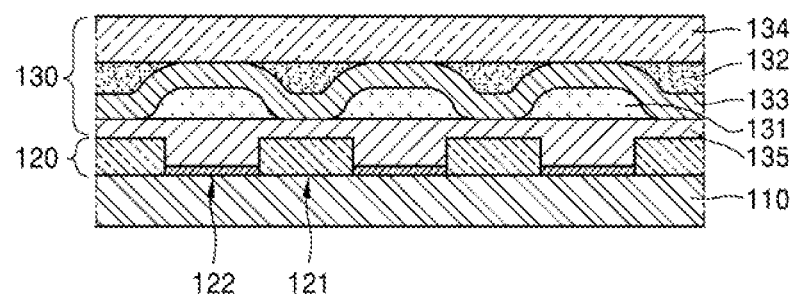

Finally, according to an embodiment, when the second inorganic film 134 is disposed as an outermost layer as shown in FIG. 5E, the thin film encapsulation layer 130 is completed.

According to an embodiment, when a display apparatus manufactured as described above is stored or carried, the display apparatus can be folded as shown in FIG. 2A or 2B. Accordingly, significant stress may be applied to a folding portion of the thin film encapsulation layer 130. However, the thin film encapsulation layer 130 has a flexible structure in which the first and second organic films 131 and 132 fill spaces between undulations of the first inorganic film 133. Therefore, cracks are unlikely to occur despite repetitive folding, and even when cracks occur, the cracks are unlikely to diffuse. Thus, the product will not be badly damaged.

According to an experiment, a thin film encapsulation layer that only has generally flat inorganic films has cracks after about 60 thousand repetitive folds, whereas a thin film encapsulation layer according to an embodiment that has an inorganic film with a undulating pattern has no cracks even after 400 thousand repetitive folds.

Therefore, despite repetitive folding and unfolding, phenomena such as the occurrence and diffusion of cracks in the thin film encapsulation layer 130 can be controlled, and thus, a highly stable display apparatus may be realized.

Figure 4C:
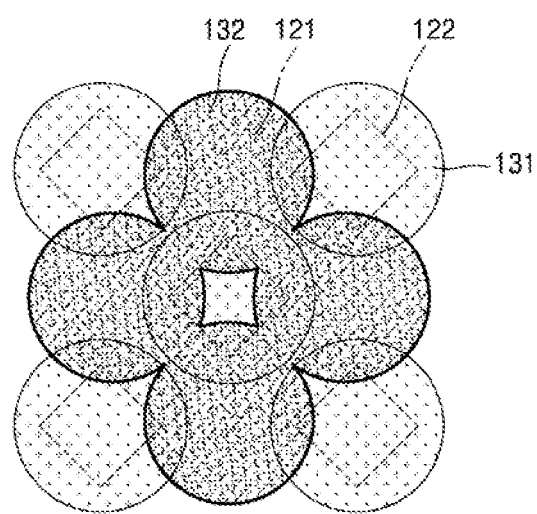
FIG. 4C is a plan view of a modified structure of an organic film arrangement shown in FIG. 4B.

A previous embodiment illustrates a case where the second organic films 132 are separated from each other in island shapes along an undulating pattern. However, when the second organic films 132 are formed by dropping ink droplets, reflow may occur before hardening, and thus, the second organic films 132 may be connected to each other. That is, as shown in FIG. 4C, the second organic films 132 are connected to each other beyond curves of the undulating pattern. An embodiment has a same structure in which the first and second organic films 131 and 132 fill space between undulations of the first inorganic film 133, and accordingly, has the same crack prevention effect.

Figure 6A:
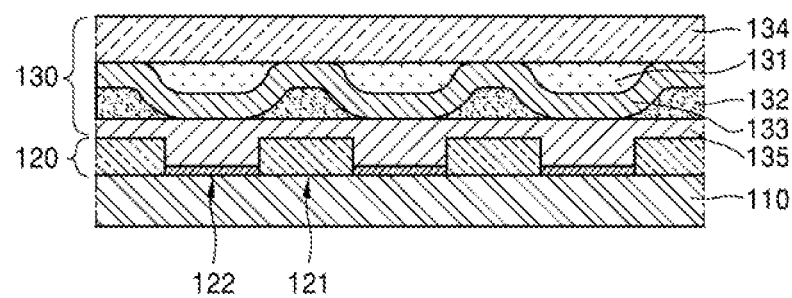
FIG. 6A is a cross-sectional view of a thin film encapsulation layer according to another embodiment.
Figure 6B:
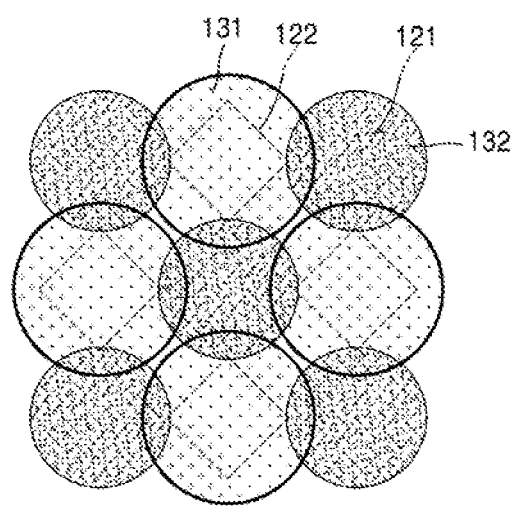
FIG. 6B is a plan view of the organic films in a thin film encapsulation layer shown in FIG. 6A.
Figure 6C:
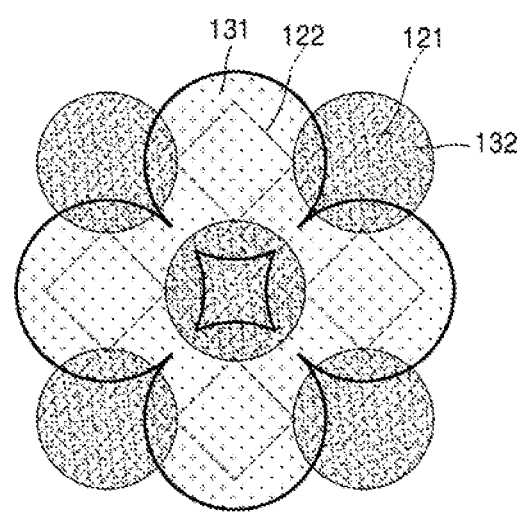
FIG. 6C is a plan view of a modified structure of an organic film arrangement shown in FIG. 6B.

FIGS. 6A to 6C illustrate another embodiment. A previous embodiment illustrated a case where the first organic film 131 that covers the emission portion 122 is an inner organic film closer to the display layer 120 and the second organic film 132 that covers the non-emission portion 121 is an outer organic film further from the display panel. However, such configurations can be reversed as shown in FIGS. 6A and 6B.

That is, according to an embodiment, the second organic film 132 is formed first as an inner organic film, and the first organic film 131 is formed on the first inorganic film 133 as an outer, organic film. Nevertheless, in the same manner, the first inorganic film 133 has an undulating pattern due to curves resulting from presence and absence of the second organic film 132, which is an inner organic film, and the first and second organic films 131 and 132 that fill the spaces between the wrinkles.

Accordingly, even when locations of the first and second organic films 131 and 132 are reversed, the same effect may be obtained.

In addition, according to an embodiment, FIG. 6B illustrates a case where first organic films 131 are separated from each other in island shapes along the undulating pattern; however, when the first organic films 131 are formed by dropping ink droplets, reflow may occur before hardening, and thus, the first organic films 131 may be connected to each other. That is, as show in FIG. GC, the first organic films 131 may be connected to each other beyond curves of the undulating pattern. A present embodiment has a same structure in which the first and second organic films 131 and 132 fill space between undulations of the first inorganic film 133, and accordingly, has a same crack prevention effect.

In conclusion, according to one or more embodiments, a display apparatus and a method of manufacturing can prevent a phenomenon in which cracks occur and diffuse in a thin film encapsulation layer even with repeated folding and unfolding operations, and thus can improve product quality.

It should be understood that exemplary embodiments described herein should be considered in a descriptive sense only and not for purposes of limitation. Descriptions of features or aspects within each embodiment should typically be considered as available for other similar features or aspects in other embodiments. While one or more exemplary embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate;
a display layer disposed on the substrate, wherein the display layer comprises a plurality of emission portions and a non-emission portion around each of the plurality of emission portions; and
a thin film encapsulation layer that covers the display layer,
wherein the thin film encapsulation layer comprises:
a first organic film that covers the plurality of emission portions;
a second organic film that covers the non-emission portion and is spaced apart from the first organic film; and
a first inorganic film interposed between the first organic film and the second organic film and
a second inorganic film disposed on the first organic film, the second organic film, and the first inorganic film,
wherein the thin film encapsulation layer further comprises a region where the first inorganic film and the second inorganic film directly contact each other.

2. The display apparatus of claim 1,
wherein the first organic film, the second organic film, and the first inorganic film are disposed on different layers from one another.

3. The display apparatus of claim 2,
wherein one of the first organic film and the second organic film is an inner organic film disposed closer to the display layer than the other of the first organic film and the second organic film and is covered by the first inorganic film, and the other of the first organic film and the second organic film is an outer organic film disposed farther from the display layer, wherein the first inorganic film comprises an undulating pattern in which a region that overlaps the inner organic film is convex in a direction away from the substrate and a region that does not overlap the inner organic film is concave in a direction toward the substrate.

4. The display apparatus of claim 3,
wherein the first organic film is the inner organic film, and the second organic film is the outer organic film.

5. The display apparatus of claim 3,
wherein the second organic film is the inner organic film, and the first organic film is the outer organic film.

6. The display apparatus of claim 1,
wherein the first inorganic film comprises an undulating pattern in which a region that overlaps one of the first organic film and the second organic film is convex in a direction away from the substrate and a region that overlaps the other of the first organic film and the second organic film is concave in a direction toward the substrate, wherein at least one of the inner organic film and the outer organic film is separated into a plurality of island-shaped organic films along the undulating pattern.

7. The display apparatus of claim 3,
wherein the outer organic film is integrally connected into a single layer beyond the undulating pattern.

8. The display apparatus of claim 1, wherein the thin film encapsulation layer further comprises:
a gas-blocking film that directly contacts the display layer.

9. The display apparatus of claim 8,
wherein the gas-blocking film comprises one of an organic film or an inorganic film.

10. The display apparatus of claim 9,
wherein the gas-blocking film comprises hexamethyldisiloxane (HMDSO).

11. A method of manufacturing a display apparatus, the method comprising:
forming a display layer on a substrate, wherein the display layer comprises a plurality of emission portions and a non-emission portion around each of the plurality of emission portions; and
forming a thin film encapsulation layer that covers the display layer,
wherein forming the thin film encapsulation layer comprises:
forming a first organic film that covers the plurality of emission portions;
forming a second organic film that covers the non-emission portion and is spaced apart from the first organic film; and
forming a first inorganic film between the first organic film and the second organic film, and
forming a second inorganic film over the first organic film, the second organic film, and the first inorganic film,
wherein the thin film encapsulation layer comprises a region where the first inorganic film and the second inorganic film directly contact each other.

12. The method of claim 11, wherein the first organic film, the second organic film, and the first inorganic film are formed on different layers from one another.

13. The method of claim 11,
wherein one of the first organic film and the second organic film is an inner organic film formed closer to the display layer than the other of the first organic film and the second organic film, wherein the first inorganic film is conned on the inner organic film and has an undulating pattern that entirely covers the display layer in which a region of the first inorganic film that overlaps the inner organic film is convex in a direction away from the substrate and a region of the first inorganic film that does not overlap the inner organic film is concave in a direction toward the substrate, wherein the other of the first organic film and the second organic film is formed on the concave region of the first inorganic film.

14. The method of claim 13,
wherein the first organic film is the inner organic film, and the second organic film is the outer organic film.

15. The method of claim 13,
wherein the second organic film is the inner organic film, and the first organic film is the outer organic film.

16. The method of claim 13,
wherein the first inorganic film is formed to have an undulating pattern in which a region that overlaps one of the first organic film and the second organic film is convex in a direction away from the substrate and a region that overlaps the other of the first organic film and the second organic film is concave in a direction toward the substrate, wherein the outer organic film is separated into a plurality of island-shaped outer organic films along the undulating pattern.

17. The method of claim 13,
wherein the outer organic film is integrally connected into a single layer beyond the undulating pattern.

18. The method of claim 11, wherein forming the thin film encapsulation layer further comprises
forming a gas-blocking film that directly contacts the display layer.

19. The method of claim 18,
wherein the gas-blocking film comprises one of an organic film or an inorganic film.

20. The method of claim 19,
wherein the gas-blocking film comprises hexamethyldisilaxane (HDMSO).

21. A display apparatus comprising:
a substrate;
a display layer disposed on the substrate and that includes a plurality of emission portions and a non-emission portion around each of the plurality of emission portions; and
a thin film encapsulation layer that covers the display layer,
wherein the thin film encapsulation layer includes a first organic film that covers the plurality of emission portions but does not entirely cover the non-emission portion, a second organic film that covers the non-emission portion but does not entirely cover the emission portions, and a first inorganic film interposed between the first organic film and the second organic film,
wherein one of the first organic film and the second organic film is an inner organic film disposed closer to the display layer than the other of the first organic film and the second organic film and is covered by the first inorganic film, and the other of the first organic film and the second organic film is an outer organic film disposed on the first inorganic film,
wherein the first inorganic film comprises an undulating pattern in which a region that overlaps the inner organic film is convex in a direction away from the substrate and a region that does not overlap tje inner organic film is concave in a direction toward the substrate, wherein at least one of the outer organic film and the inner organic film is separated into a plurality of island-shaped organic films along the undulating pattern, and wherein the first inorganic film is formed as a single body.

22. The display apparatus of claim 21, wherein:

the second organic film is spaced apart from the first organic film.

* * * * *